United States Patent [19]

Hanakawa et al.

[11] Patent Number: 4,868,502

[45] Date of Patent: Sep. 19, 1989

[54] MAGNETIC RESONANCE IMAGING METHOD AND APPARATUS THEREFOR

[75] Inventors: Kazushi Hanakawa; Kiyoshi Yoda, both of Hyogo, Japan

[73] Assignee: Mitsubishi Denki Kabushiki Kaisha, Tokyo, Japan

[21] Appl. No.: 152,622

[22] Filed: Feb. 5, 1988

[30] Foreign Application Priority Data

Feb. 5, 1987 [JP] Japan .................................. 62-23597
Feb. 16, 1987 [JP] Japan .................................. 62-31397

[51] Int. Cl.⁴ .......................................... G01R 33/20
[52] U.S. Cl. ................................ 324/309; 324/307
[58] Field of Search ............... 324/300, 307, 308, 309, 324/311

[56] References Cited

U.S. PATENT DOCUMENTS 4,527,124 7/1985 Van Uijen ........................... 324/307

FOREIGN PATENT DOCUMENTS 2079946A 1/1982 United Kingdom .

OTHER PUBLICATIONS

"Magnetic Resonance Imaging" vol. 3, No. 3-pp. 297-299 (1985).
"American Journal of Roentgenology", vol. 138, pp. 201-210 1982 Nuclear Magnetic Resonance Imaging: The Current State.

Primary Examiner—Michael J. Tokar
Attorney, Agent, or Firm—Wolf, Greenfield & Sacks

[57] ABSTRACT

A magnetic resonance imaging method and apparatus for obtaining images of slices of a body placed in a static magnetic field. During the sampling of one NMR signal, an additional second gradient magnetic field is impressed on the body to acquire data. These data are additionally sampled during each sampling. This enables the number of data to be increased and the number of repetitions to be reduced, thereby accomplishing a Fourier transformation at a higher speed.

9 Claims, 9 Drawing Sheets

MAGNETIC RESONANCE IMAGING METHOD AND APPARATUS THEREFOR

BACKGROUND OF THE INVENTION

1. Technical Field of the Invention

The present invention relates to a magnetic resonance imaging method and an apparatus therefor which utilize an NMR (Nuclear Magnetic Resonance) phenomenon, and more particularly, to a magnetic resonance imaging method and an apparatus therefor by means of which high speed two-dimensional and three-dimensional Fourier transformations can be attained.

2. Description of the Prior Art

Referring to FIG. 1, illustrated is a block diagram of a typical magnetic resonance imaging apparatus which is a simplified version of the magnetic resonance imaging apparatus released by A. James and others in "American Journal of Radiology" (pages 106 and 206, Vol. 138).

In the figure, the numeral 1 designates a magnet; 2 indicates a body, for instance, a human body lying in a static magnetic field created by the magnet I; 3 denotes a high frequency coil wound around the human body 2; 4 indicates a transmitter/receiver for transmitting an electromagnetic wave to the high frequency coil 3 and receiving an electromagnetic wave (NMR signal) coming from the human body 2; 5 represents a plurality of pairs of gradient magnetic field coils disposed between the magnet 1 and the high frequency coil 3; and 6 is a power source for driving the gradient magnetic field coils 5.

A control circuit generally indicated at 7 serves to control the high frequency coil 3 and the gradient magnetic field coils 5 through the transmitter/receiver 4 as well as through the gradient magnetic field coil power source 6. This control circuit includes sampling means (not illustrated) for obtaining the NMR signal from the human body 2 at a predetermined sampling frequency. The numeral 8 is a computer linked to the control circuit 7. This computer has image reforming means (not illustrated) for obtaining an image on the basis of the received NMR signal. The numeral 9 represents an image display connected to the computer 8.

Next, the operation of a typical magnetic resonance imaging apparatus as depicted in FIG. 1 will be elucidated.

Firstly, the magnetic 1 applies to the human body 2 a uniform static magnetic field in the direction Z, whereby specified atomic nuclei within the human body 2 are irradiated with the electromagnetic wave having the Zeeman energy from a transmitting unit of the transmitter/receiver 4 through the high frequency coil 3. The electromagnetic wave causes the specified atomic nuclei to perform the resonant transition from the ground state to an excited state.

Then the irradiation of electromagnetic wave is halted. Subsequently, the electromagnetic wave emitted from the atomic nuclei within the human body 2 is detected through the high frequency coil 3 by means of a receiving unit of the transmitter/receiver 4. The transmitter/receiver 4 incorporates a receiving A/D converter for receiving the NMR (Nuclear Magnetic Resonance) signal from the high frequency coil 3 in accordance with the predetermined sampling frequency.

In this case, a slope is given to the static magnetic field by use of the gradient magnetic field coils 5, thereby deciding from which positions of the human body 2 the signal is coming. In practice, the gradient magnetic field coils 5 are composed of three pairs of coils for generating the first gradient magnetic field Gz, the second gradient magnetic field Gy, and the third gradient magnetic field Gx in three orthogonal axial directions Z, Y and X, respectively.

On the other hand, the computer 8 serves to control both the power source 6 for supplying an electric current to the gradient magnetic coils 5 and the transmitter/receiver 4 through the control circuit 7, and also permits the image display 9 to display a resultant image obtained in accordance with the high speed Fourier transformation. It is to be noted that details of the magnetic resonance imaging method based on the Fourier transformation are disclosed in, for instance, British Pat. No. 2,079,946, and hence a detailed description is not given herein.

A conventional magnetic resonance imaging method performed in association with the two-dimensional Fourier transformation using the magnetic resonance imaging apparatus depicted in FIG. 1 will now be explained.

Referring to FIG. 2, a pulse sequence diagram is shown that explains the prior art magnetic resonance imaging method (a FLASH method) as described in, e.g., the magazine "Magnetic Resonance Imaging" (page 297, Vol. 3). The reference symbol RF indicates a high frequency magnetic field pulse generated from the high frequency coil 3 on the basis of the pulse transmitted from the transmitter/receiver 4; Gz, Gy and Gx denote the first, second and third gradient magnetic fields, respectively, each corresponding to one of the three orthogonal axial directions Z, Y and X; and S represents an NMR signal, i.e., a spin echo signal received by the transmitter/receiver 4 through the high frequency coil 3.

First Section

The high frequency magnetic field pulse $RF^{(1)}$ having a decline angle smaller than a spin decline angle of 90°, preferably of approximately 30°, is applied under the first gradient magnetic field $Gz^{(l)}$. As a result, the nuclear spin within a slice having a predetermined thickness in the direction Z is excited.

Second Section

A Z-directional phase disturbance is corrected by impressing the polarity-inverted first gradient magnetic field $Gz^{(2)}$. In this case, the area of a portion A depicted with oblique hatching is equal to that of a similarly hatched portion B. Simultaneously, the phases of spin both in the direction of the second gradient magnetic field (direction Y) and in the direction of the third gradient magnetic field (direction X) are disturbed by impressing the second gradient magnetic field $Gy^{(2)}$ and the third gradient magnetic field $Gx^{(2)}$ preparatory to acquisition of the spin echo signal $S^{(3)}$ in the third section.

Third Section

The first and second gradient magnetic fields Gz and Gy are set to zero, and, the polarity-inverted third gradient magnetic field $Gz^{(3)}$ is applied, this value being kept constant. In consequence, the spin echo signal $S^{(3)}$ is observed as the NMR signal. The intensity of the spin echo signal $S^{(3)}$ reaches its peak just when the area of the third gradient magnetic field $Gx^{(3)}$ (indicated by oblique lines) accords with the area of the third gradient magnetic field Gx$^{(2)}$ (indicated by oblique lines) in the second section. Distribution of spin in the direction X is reflected in the frequency spectrum of the spin echo signal S$^{(3)}$, while distribution of spin in the direction Y is reflected in the phase of the NMR signal S$^{(3)}$. The spin echo signals S$^{(3)}$ are acquired at a plurality (N$_1$) of sampling points at the sampling frequency.

A sequence of the first, second and third sections is repeatedly executed N$_2$ times while varying, as depicted with a broken line, the intensity (the gradient value) of the second gradient magnetic field Gy. The plurality (N$_1$×N$_2$) of spin echo signals S$^{(3)}$ procured in this way undergoes bidimensional Fourier transformation, thus acquiring a density distribution of the nuclear spin on the plane X-Y within a slice which has the predetermined thickness in the direction Z. Thus a sectional image of the human body 2 is obtained.

Next, a conventional magnetic resonance imaging method in accordance with three-dimensional Fourier transformation using the magnetic resonance imaging apparatus depicted in FIG. 1 will be explained.

Referring to FIG. 3, a pulse sequence diagram of the prior art magnetic resonance imaging method disclosed in, e.g., Japanese Patent Laid-Open Publication No. 68656/1984, is shown. The reference symbol RF indicates a high frequency magnetic field pulse generated from the high frequency coil 3 on the basis of the pulse transmitted from the transmitter/receiver 4; Gz, Gy and Gx denote the first, second and third gradient magnetic fields, respectively, each corresponding to the three orthogonal axial directions Z, Y and X, and S represents an NMR signal, i.e., a spin echo signal received by the transmitter/receiver 4 through the high frequency coil 3.

First Section

The high frequency gradient magnetic field pulse, viz., the approximately 90° pulse RF$^{(1)}$ having a decline angle $\theta$ of 90° is impressed under the first gradient magnetic field GZ$^{(1)}$. As a result, nuclear spin within a slice of the human body 2 having a predetermined thickness in the direction Z is excited.

Second Section

Z-directional phase disturbance is corrected by impressing the polarity-inverted first inclined magnetic field Gz$^{(2)}$. In this case, the area of the hatched portion A is equal to that of the hatched portion B. Simultaneously, the spin phases in the directions Y and X are disturbed by impressing the second and third gradient magnetic fields Gy$^{(2)}$ and Gx$^{(2)}$ preparatory to acquisition of the spin echo signal S$^{(4)}$ in the subsequent fourth section.

Third Section

The approximately 180° pulse RF$^{(3)}$, i.e., the high frequency magnetic field pulse, having the spin decline angle $\theta$ of 180° is impressed.

Fourth Section

The first and second gradient magnetic fields Gz and Gy are set to be zero, and the third gradient magnetic field Gx$^{(4)}$ is impressed and kept constant. As a result, the spin echo signal S$^{(4)}$ is observed as the NMR signal. The intensity of the spin echo signal S$^{(4)}$ reaches its peak just when the area of a hatched portion D of the third gradient magnetic field Gx$^{(4)}$ coincides with that of a hatched portion C of the third gradient magnetic field Gx$^{(2)}$. Distribution of spin in the direction X is reflected in the frequency spectrum of the spin echo signal S$^{(4)}$, while the distribution of spin in the direction Y is reflected in the phase of the NMR signal S$^{(4)}$. The spin echo signal S$^{(4)}$ is procured at a plurality of sampling points (not shown) in accordance with the sampling frequency.

In the fourth section, an additional second gradient magnetic field Gy$^{(4)}$ having a frequency equal to and synchronized with the sampling frequency is impressed together with the third gradient magnetic field Gx$^{(4)}$. Namely, the integrated value for one period of the additional second gradient magnetic field Gy$^{(4)}$ is arranged to be zero. Hence, the points marked with "O" coincide with the normal sampling points, and phase disturbance for half a period is caused by the additional second gradient magnetic field Gy$^{(4)}$. There is an addition of the phase disturbance of the second gradient magnetic field Gy$^{(2)}$ in the second section at the points indicated by "O". On the other hand, at the points marked with "X", the phase disturbance for half a period of the additional second gradient magnetic field Gy$^{(4)}$ is added to the phase disturbance of the second gradient magnetic field Gy$^{(2)}$. In this manner, the data relating to the two phases, viz., two-fold sampling data, are acquired from the single spin echo signal S$^{(4)}$ by virtue of impressing the additional second gradient magnetic field Gy$^{(4)}$.

Subsequently, the sequence from the first section to the fourth section is repeatedly executed while changing, as illustrated by a broken line, the intensity (the gradient value) of the second gradient magnetic field Gy. The plurality of thus obtained spin echo signals S$^{(4)}$ undergo the tridimensional Fourier transformation, thereby obtaining density distribution of the nuclear spin on the plane X-Y within a slice of the human body 2 having a predetermined thickness in the direction Z. As a result, sectional images of the human body 2 are obtained.

Assuming the repetitive time to be T$_R$, the number of repetitions which are required for collecting data of one slice when impressing no additional second gradient magnetic field Gy$^{(4)}$ to be l, and the number of slices to be n, the time necessary for collecting the tridimensional data without impressing the additional second gradient magnetic field Gy$^{(4)}$ can be expressed as T$_R$ln. In contrast with this, as illustrated in FIG. 3, when impressing the additional second gradient magnetic field Gy$^{(4)}$ having the frequency equal to the sampling frequency, since the number of repetitions is merely 1/2, the time is T$_R$ln/2, and it follows that the time for acquiring data is reduced by half.

As discussed above, in the prior art magnetic resonance imaging method and the apparatus therefor using two-dimensional Fourier transformation, because the second gradient magnetic field Gy becomes zero when acquiring one spin echo signal S$^{(3)}$, the Y-directional phase remains fixed, viz., only one phase datum can be acquired from the single spin echo signal S$^{(3)}$. The spin echo signal S$^{(3)}$ can be utilized for nothing but the datum of the second gradient magnetic field Gy$^{(2)}$. Hence, image reformation requires much time because of the increased number N$_2$ of repetitions of the sequence of the first, second and third sections. This causes a problem in that a sufficient speed-up can not be accomplished.

Also in the prior art magnetic resonance imaging using three-dimensional Fourier transformation, speed-up has been attained by impressing the additional second gradient magnetic field Gy$^{(4)}$ together with the third gradient magnetic field Gx$^{(4)}$ when acquiring the spin echo signals S$^{(4)}$. Because only the data of one phase can be acquired from one spin echo signal S$^{(4)}$ with respect to the first gradient magnetic field Gz, the formation of a tridimensional image requires much time, making it impossible to attain sufficient speed-up.

SUMMARY OF THE INVENTION

It is a general object of the present invention to obviate the problems of the prior art described above.

It is one object of the present invention to provide a magnetic resonance imaging method and apparatus therefor which are capable of effecting a sufficiently speedy two-dimensional Fourier transformation by acquiring, from one spin echo signal, data having different phases in the direction of the second gradient magnetic field, thereby reducing the required number of repetitions of the sequence.

According to one aspect of the present invention, a magnetic resonance imaging method comprises the steps of, when acquiring an NMR signal, impressing an additional second gradient magnetic field changing periodically at a frequency equal to or higher than the sampling frequency, and effecting at least one additional sampling process during each sampling.

According to another aspect of the present invention, a magnetic resonance imaging apparatus is provided that has a control circuit comprising means for generating a additional second gradient magnetic field which varies periodically at a frequency equal to or higher than the sampling frequency, and means for effecting at least one sampling during each sampling.

Accordingly, the number of data acquired from one single NMR signal is increased and the two-dimensional Fourier transformation is effected at a higher speed.

It is another object of the present invention to provide a magnetic resonance imaging method and apparatus therefor which are capable of obtaining three-dimensional images at a sufficiently high speed by acquiring, from one spin echo signal, data having different phases in the directions of the first and second gradient magnetic fields, thereby reducing the required number of repetitions of the sequence.

According to another aspect of the present invention, a magnetic resonance imaging method is provided that comprises the steps of: impressing an additional first magnetic field periodically varying at a frequency equal to a sampling frequency and an additional second gradient magnetic field periodically varying at a frequency which is at least double the sampling frequency when obtaining an NMR signal; and performing at least three additional sampling processes during each sampling.

According to still another aspect of the present invention, a magnetic resonance imaging apparatus is provided that comprises a control circuit including means for generating an additional first gradient magnetic field periodically varying at a frequency equal to the sampling frequency and an additional second gradient magnetic field periodically varying at a frequency which is at least double the sampling frequency, and means for performing at least three sampling processes during each sampling.

Accordingly, during the sampling of one NMR signal, data having different phases in the directions of the first and second gradient magnetic fields are obtained and these data are additionally sampled. This greatly increases the number of data concerning the phases obtained from one NMR signal, thereby reducing the number of slices and repetitions and accomplishing the three-dimensional Fourier transformation at a higher speed.

DESCRIPTION OF THE PREFERRED EMBODIMENTS

Figure 4:
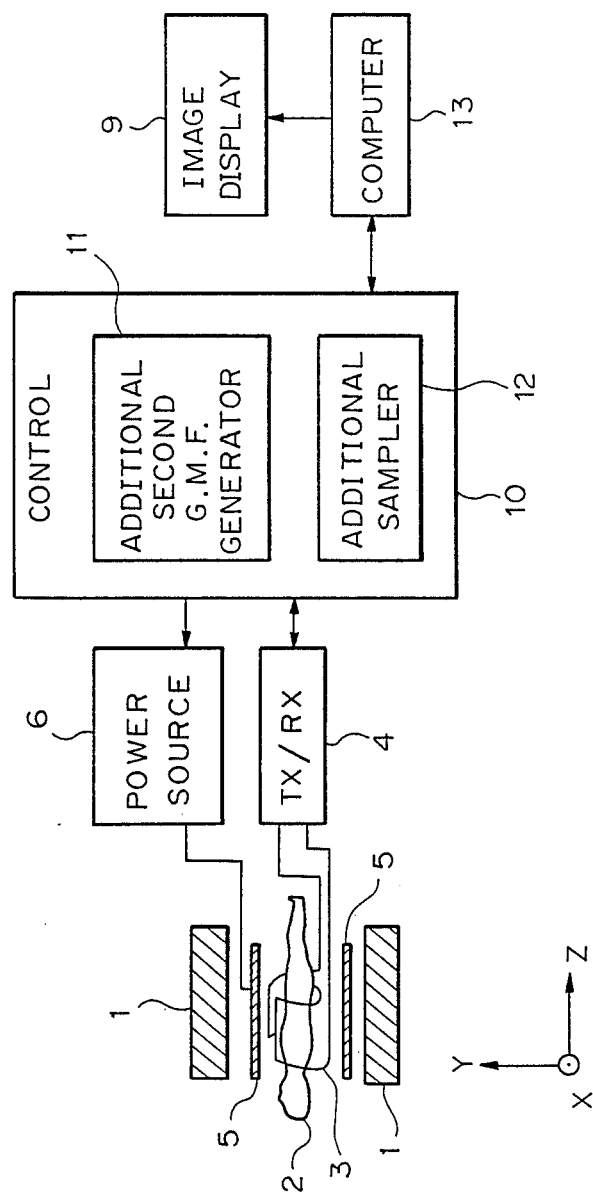
FIG. 4 is a block diagram of one embodiment of a magnetic resonance imaging apparatus according to the present invention.

FIG. 4 shows a block diagram of an embodiment of a magnetic resonance imaging apparatus according to the present invention. In this figure, identical elements are designated by the same symbols and numerals as used in FIG. 1. The apparatus depicted in FIG. 4 has a control circuit 10 which includes an additional second gradient magnetic field generating means 11 and an additional sampling means 12, in addition to the means for generating three orthogonal gradient magnetic fields Gz, Gy and Gx and the means for sampling spin echo signals as described in connection with the control circuit 7 of the prior art apparatus. The control circuit 10 is connected to a computer 13 which is programmed to be capable of operating in the manner described hereafter. Namely, the magnetic resonance imaging apparatus used is arranged such that a static magnetic field is provided by the magnet 1 in the direction Z (the thicknesswise direction) perpendicular to an arbitrary slice of the human body 2, that the gradient magnetic field Gz, Gy and Gx are impressed in the directions Z, Y and X, respectively, and that the high frequency magnetic field pulse RF is transmitted and received in the direction Y (or X) perpendicular to the direction Z. The cosine and sine components which are 90 degrees out of phase with respect to each other are received as the NMR signal, i.e., spin echo signal S, and the signal is then processed based on the QD (Quadration Detection) method.

Figure 2:
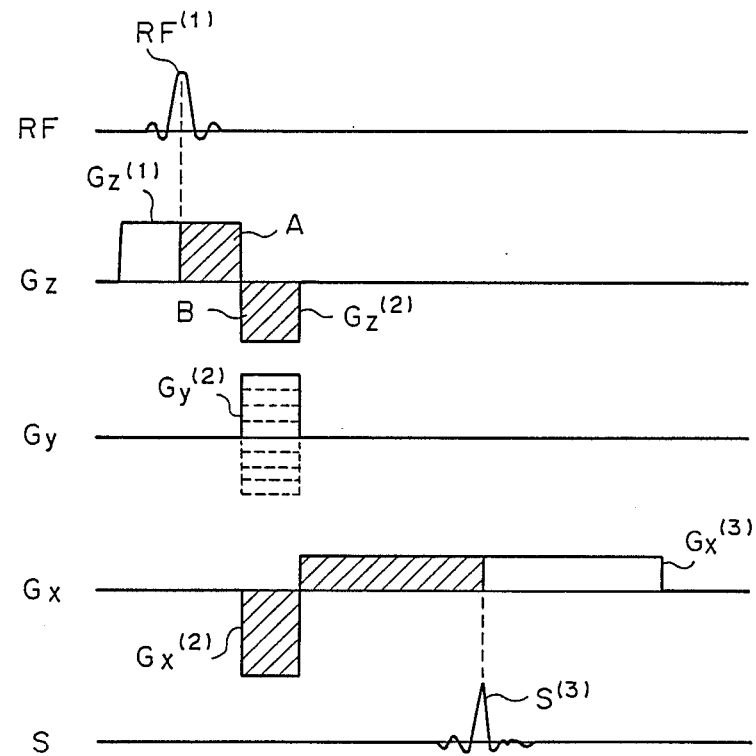
FIG. 2 is a pulse sequence diagram for explaining a conventional magnetic resonance imaging method using the apparatus shown in FIG. 1.
Figure 5:
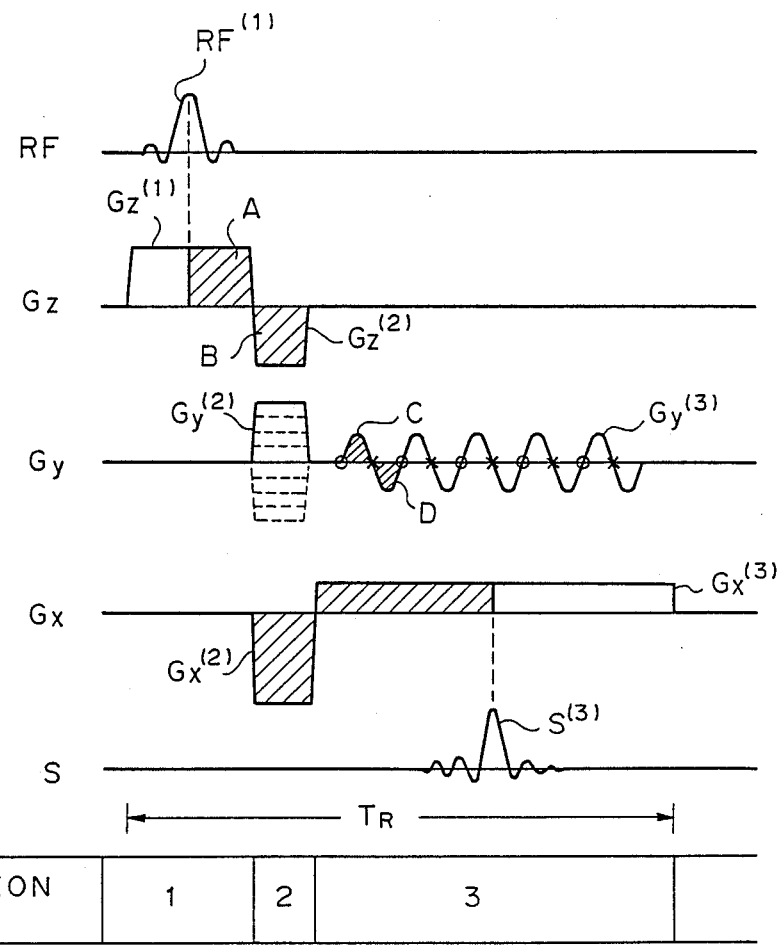
FIG. 5 is a pulse sequence diagram for explaining a magnetic resonance imaging method using the apparatus shown in FIG. 4.

The operation of this embodiment of the magnetic resonance imaging apparatus will be elucidated, referring to FIGS. 4 and 5. The pulse sequence diagram of FIG. 5 is the same as FIG. 2 except that the additional second gradient magnetic field Gy$^{(3)}$ is impressed in the third section. The description of the first and second sections is the same as that given above, and, therefore, is omitted here.

Third Section

The first gradient magnetic field Gz is set to be zero, and the spin echo signal $S^{(3)}$ is acquired while impressing the third polarity-inverted gradient magnetic field $Gx^{(3)}$. At this time, the additional second gradient magnetic field generating means 11 incorporated in the control circuit 10 performs the function of impressing the additional second magnetic field $Gy^{(3)}$ which periodically varies at a frequency equal to or higher than the sampling frequency. The additional second gradient magnetic field $Gy^{(3)}$ substantially assumes the sine waveform; the area of the hatched portion C is equal to that of another hatched portion D; and the integrated value for one period is zero. Hence, each point indicated by "O" subsumes phase disturbance of the second gradient magnetic field $Gy^{(2)}$ in the second section because of the cancellation of the phase for half a period, and coincides with the ordinary sampling point. The additional sampling means 12 incorporated in the control circuit 10 serves to perform the additional sampling process during each sampling (at points indicated by "X") and to acquire from the single spin echo signal $S^{(3)}$, data having different phases in the direction of the second gradient magnetic field Gy. That is, the additional sampling means 12 is arranged to execute at least one additional sampling process during each sampling.

Consideration will now be given to the case where the points marked with "O" are sampled, that is, the case of acquiring data at the ordinary sampling frequency. Assuming the phase in the direction of the second gradient magnetic field Gy to be $\theta o$, and the phase variation corresponding to the area of the hatched portion C to be $\theta c$, when sampling only the points marked with "X" (in the case of acquiring data by the additional sampling), it follows that the data have a phase of $(\theta o + \theta c)$. It is therefore possible to acquire two kinds of data having different phases in the direction Y from one spin echo signal $S^{(3)}$.

The sequence consisting of the first, second and third sections is repeatedly executed while varying the second gradient magnetic field $Gy^{(2)}$, and a plurality of spin echo signals $S^{(3)}$ are acquired, thereby reforming the image in accordance with the bidimensional Fourier transformation. In this case, the number of repetitions is one-half of that in the prior art. Hence, the time required for the bidimensional Fourier transformation can be reduced to half, thereby accomplishing the speed-up, which is twice as fast as the prior art.

In this way, even if a repetition time $T_R$ is reduced by employing the high frequency magnetic pulse $RF^{(1)}$ having the decline angle $\theta$ of 30°, it is feasible to utilize the spin echo signal $S^{(3)}$ effectively while preventing a reduction of the NMR signal S, and to obtain the magnetic resonance images at a higher velocity.

In the above-mentioned embodiment, the spin decline angle $\theta$ in association with the high frequency magnetic field pulse $RF^{(1)}$ is set to 30°, but the decline angle may be determined to satisfy the following formula on condition that the value is smaller than 90°.

$$\cos \theta = \exp(-T_R/T_1)$$

where $T_1$ is the vertical relaxation time. In such a case, as a matter of course, the spin echo signal $S^{(3)}$ is maximized.

The foregoing description is focused on the case where one additional sampling point is provided for one period of the additional second gradient magnetic field $Gy^{(3)}$. However, speed-up over three times as fast as the case described above may be attained by providing two or more additional sampling points.

Turning now to FIGS. 6, 7, 8 and 9, explanation will be given of another embodiment of a magnetic resonance imaging method and an apparatus therefor according to the present invention.

Figure 1:
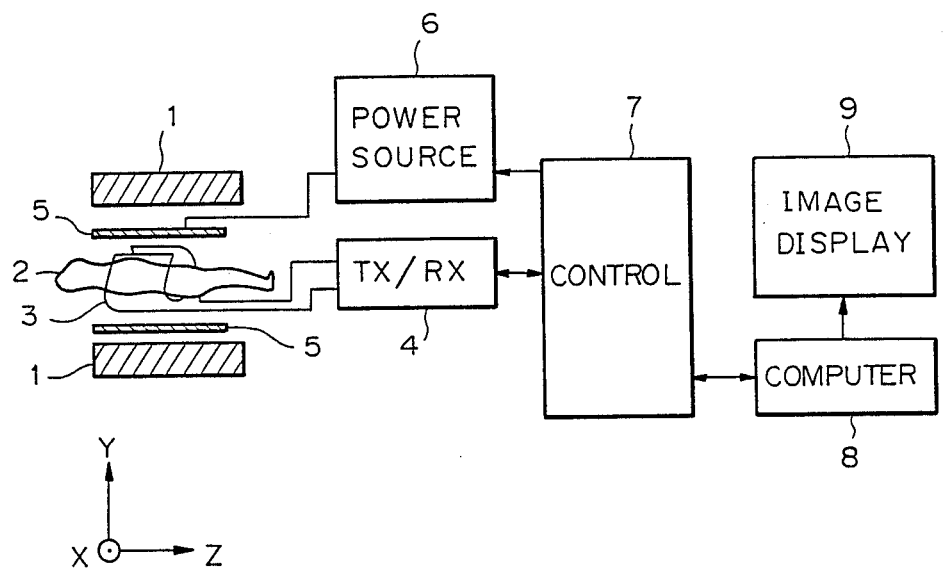
FIG. 1 is a block diagram of a typical magnetic resonance imaging apparatus of the prior art.
Figure 6:
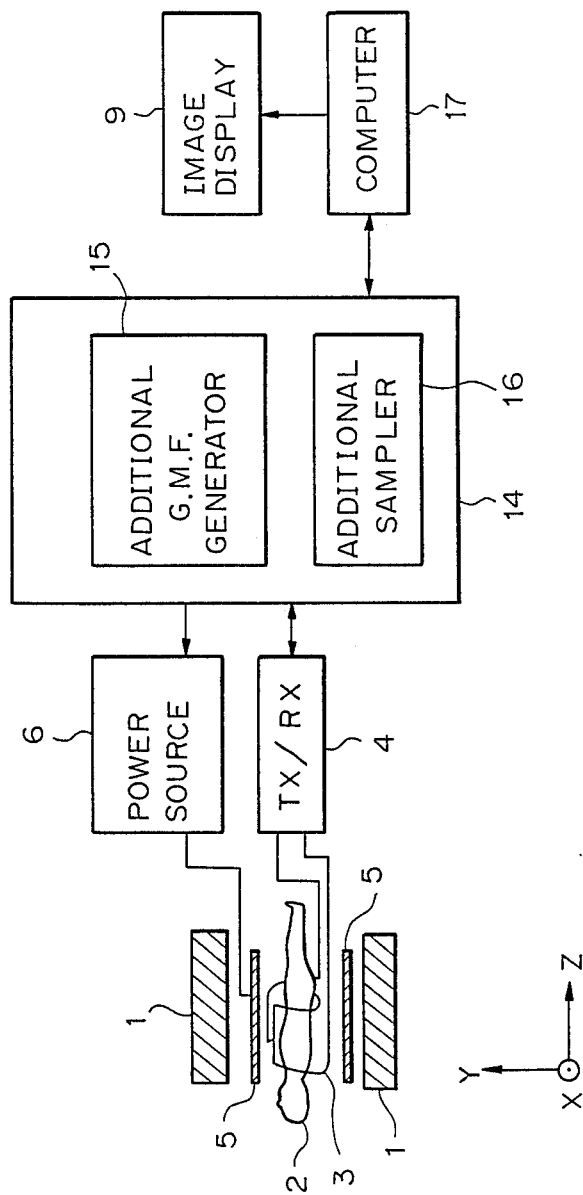
FIG. 6 is a block diagram of another embodiment of a magnetic resonance imaging apparatus according to the present invention.

FIG. 6 shows a block diagram of a magnetic resonance imaging apparatus using a three-dimensional Fourier transformation according to the present invention In this figure, identical elements are designated by the same symbols and numerals as those used in FIG. 1. The apparatus of FIG. 6 includes a control circuit 14 having an additional gradient magnetic field generating means 15 and an additional sampling means 16, and a computer 17 which is programmed to process NMR signals.

Namely, the magnetic resonance imaging apparatus for use is arranged such that: a static magnetic field is created by the magnet I in the direction Z (the thicknesswise direction) perpendicular to an arbitrary slice of the body, that the gradient magnetic field Gz, Gy and Gx are impressed in the directions Z, Y and X, respectively, and that the high frequency magnetic field pulse is transmitted and received in the direction Y (X) perpendicular to the direction Z. Both cosine and sine components that are 90 degrees out of phase with each other are received as the NMR signals, that is, the spin echo signals to be processed by the QD (Quadration Detection) method.

Figure 7:
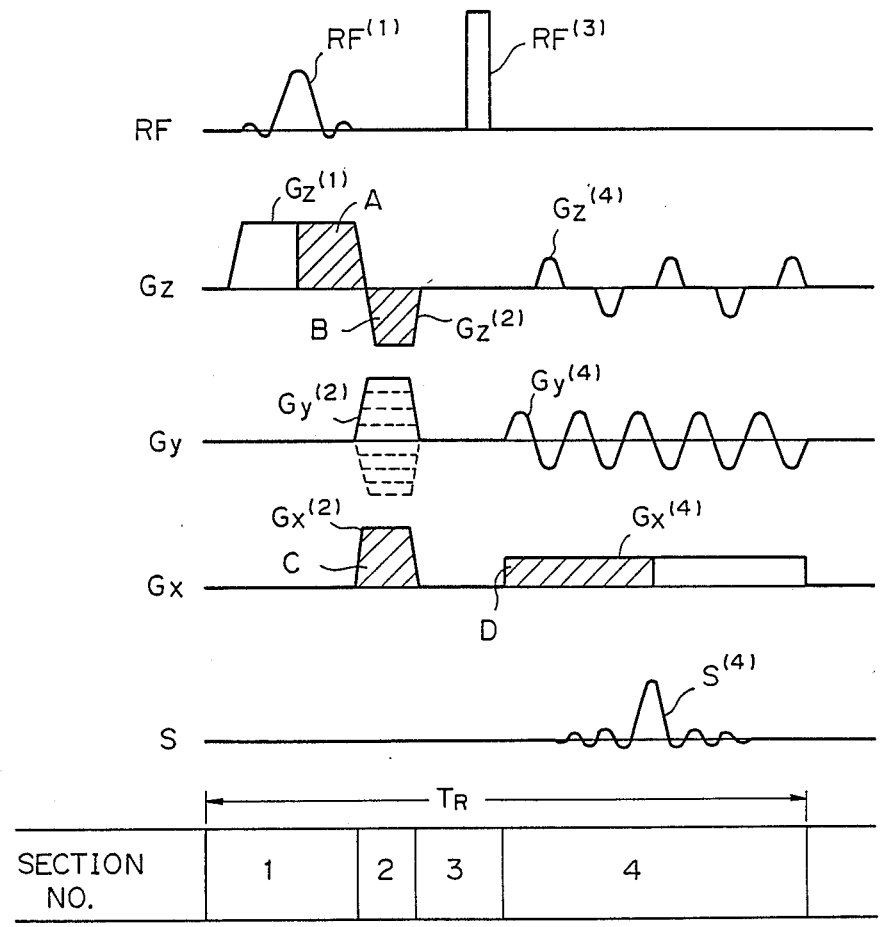
FIG. 7 is a pulse sequence diagram for explaining a magnetic resonance imaging method using the apparatus shown in FIG. 6.
Figure 8:
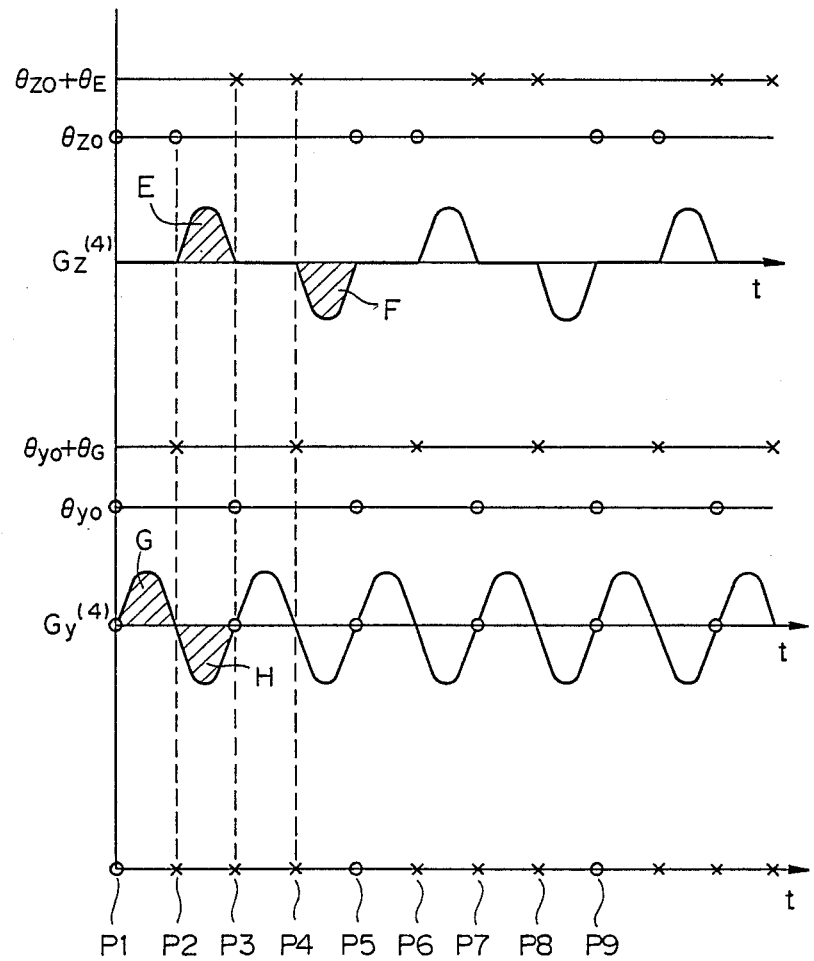
FIG. 8 shows one example of phase changes in the directions X and Y in the fourth section of FIG. 7.
Figure 9:
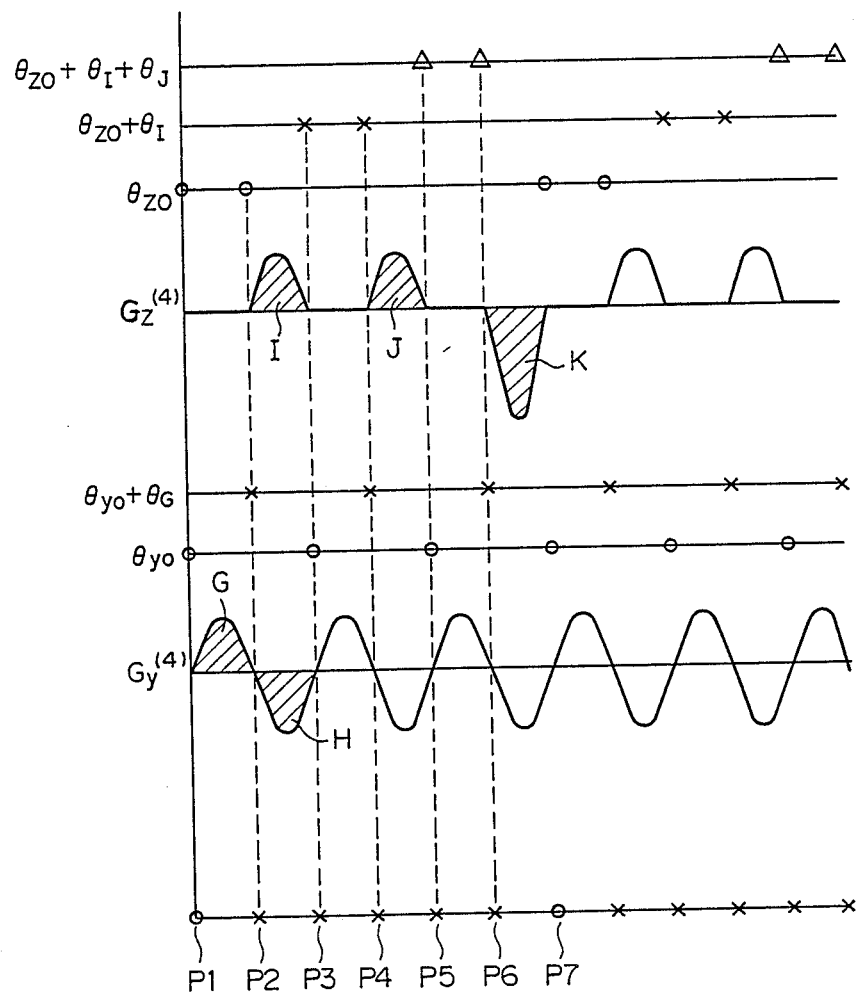
FIG. 9 shows another example of phase changes in the directions X and Y in the fourth section of FIG. 7.

FIG. 7 is a pulse sequence diagram employed to illustrate the signal processing operation in the magnetic resonance imaging apparatus of FIG. 6. In FIG. 7, the reference symbols RF, Gz, Gy, Gx and S have the same meanings as those described above. FIG. 8 is an explanatory diagram illustrating an example of variations in respective phases in the directions of the first and second gradient magnetic fields (directions Z and Y) in the fourth section of FIG. 6.

Figure 3:
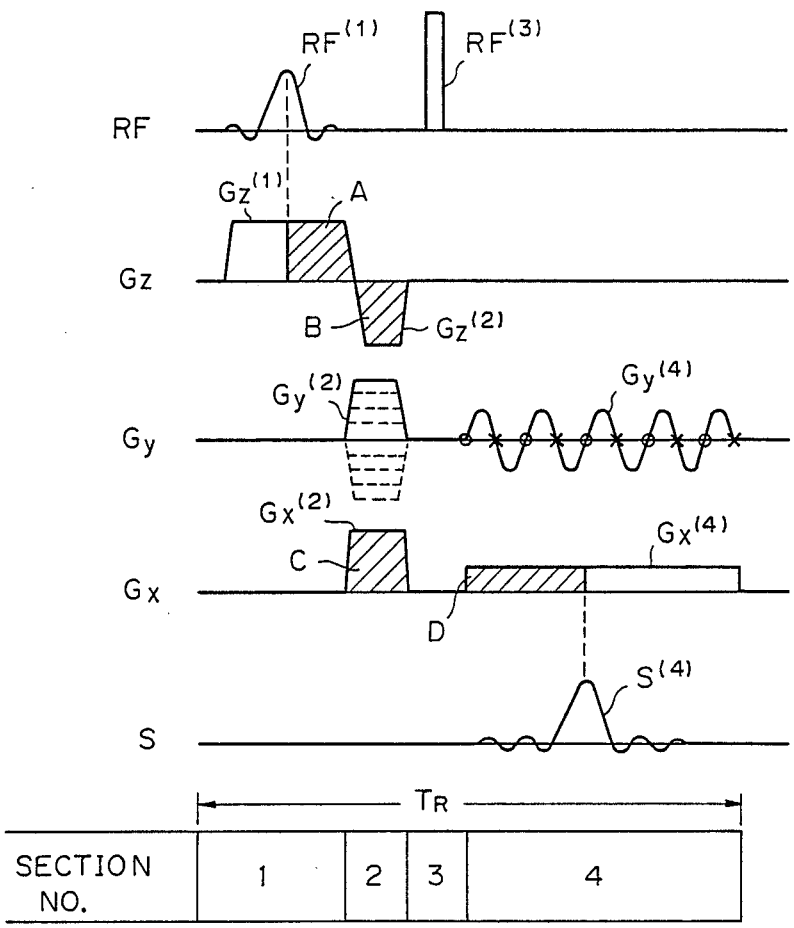
FIG. 3 is a pulse sequence diagram for explaining another conventional magnetic resonance imaging method using the apparatus shown in FIG. 1.

Next, the operation of the magnetic resonance imaging method and the apparatus according to the present invention will be elucidated, referring to FIGS. 6 and 7. The pulse sequence diagram of FIG. 5 is the same as FIG. 3 except that a value of gradient of the first gradient magnetic field $Gz^{(2)}$ is varied each time the sequence in the second section is repeated, and that the additional first and second gradient magnetic fields $Gz^{(4)}$ and $Gy^{(3)}$ are impressed in the fourth section. Hence, the description concerning the first, second and third sections in one sequence is the same as that given above, and the explanation therefore starts from the fourth section.

Fourth Section

The spin echo signal $S^{(4)}$ is obtained while impressing the polarity-inverted third gradient magnetic field $Gx^{(4)}$. At this time, the additional gradient magnetic field generating means 15 incorporated in the control circuit 14 serves to impress the additional first gradient magnetic field $Gz^{(4)}$ which periodically varies at the frequency equal to the sampling frequency and the additional second gradient magnetic field periodically varying at a frequency which is at least double the sampling frequency. In this embodiment, the additional second gradient magnetic field periodically varies at a frequency double the sampling frequency. The area of a hatched portion E (FIG. 8) of the additional first gradient magnetic field Gz$^{(4)}$ is equal to that of a hatched portion F thereof (see FIG. 2). Similarly, the area of a hatched portion G of the additional second gradient magnetic field Gy$^{(4)}$ is equal to that of a hatched portion H thereof. Consequently, the integrated value for one period of each of the additional first and second gradient magnetic fields Gz$^{(4)}$ and Gy$^{(4)}$ is zero.

Sampling points P1, P5 . . . marked with "O" indicate those associated with the normal sampling frequency, while sampling points P2, P3, P4, P6 . . . marked with "X" indicate those based on the additional sampling process. Hence, the additional sampling means 16 provided in the control circuit 14 performs at least three additional sampling processes during each sampling (for example, between the sampling points P1 and P5), and the data having different phases in the directions Z and Y are acquired from one spin echo signal S$^{(4)}$.

Let the phase disturbance caused by the second gradient magnetic field Gy$^{(2)}$ be $\theta$yo, let the phase disturbance corresponding to a difference (A−B) between the hatched areas which correspond to the first gradient magnetic fields Gz$^{(1)}$ and Gz$^{(2)}$, respectively, be $\theta$zo, let the phase disturbance caused by the hatched portion E of the additional first gradient magnetic field Gz$^{(4)}$ be $\theta_E$, and let the phase disturbance caused by the hatched portion G of the additional second gradient magnetic field Gy$^{(4)}$ be $\theta_G$. The Z-directional phase exhibits the state of $\theta$zo indicated by "O" and the state of ($\theta$zo+$\theta_E$) indicated by "X". The Y-directional phase also assumes the state of $\theta$yo indicated by "O" and the state of ($\theta$yo+$\theta_G$) indicated by "X".

The phase (in the directions Z and Y) at the first sampling point P1 is therefore expressed as ($\theta$zo, $\theta$yo). The phases at the additional sampling points P2 through P4 are expressed by ($\theta$zo, $\theta$yo+$\theta_G$), ($\theta$zo+$\theta_E$, $\theta$yo) and ($\theta$zo+$\theta_E$, $\theta$yo+$\theta_G$), respectively. Hence, it is feasible to acquire four kinds of data having different phases in the directions Z and Y, two for each direction, from the single spin echo signal S$^{(4)}$.

Subsequently, the sequence consisting of the first, second, third and fourth sections is repeatedly executed while varying, as shown by broken lines, the first and second gradient magnetic fields Gz$^{(2)}$ and Gy$^{(2)}$. The number of slices may, however, be reduced to half the number of the prior art. Accordingly, the sampling frequency appears to be quadrupled in comparison with the case of sampling at the ordinary sampling points P1, P5 . . . , and the time required for forming an image on the basis of the tridimensional Fourier transformation is given by:

$$T_R \times (l/2) \times (n/2) = T_R ln/4$$

Namely, the time is reduced to a quarter of the time needed in the prior art.

In the above-described embodiment, the frequency of the additional second gradient magnetic field Gy$^{(4)}$ is set to be double the sampling frequency. However, the frequency of the additional second gradient magnetic field may be set to be triple or more to attain further speed-up. FIG. g is an explanatory diagram illustrating variations in phase in the fourth section when the frequency of the additional second gradient magnetic field Gy$^{(4)}$ is set to be three times as high as the sampling frequency.

In this case, relations between the areas of hatched portions I, J and K of the additional first gradient magnetic field Gz$^{(4)}$ are expressed as I=J and I+J=K. The Z-directional phase exhibits three kinds of states, $\theta$zo indicated by "O", (Ozo+$\theta_I$) indicated by "X" and ($\theta$zo+$\theta_I$+$\theta_J$) indicated by "Δ". On the other hand, the Y-directional phase assumes two states, $\theta$yo indicated by "O" and ($\theta$yo+$\theta_G$) indicated by "X". The sampling points P2 through P6 marked with "X" are the additional sampling points; and five additional sampling processes are to be effected between the ordinary sampling points P1 and P7.

Hence, the phases at the first sampling point P1 and the additional sampling points P2 through P4 are the same as those shown in FIG. 8. The phases at the additional sampling points P5 and P6 are, however, expressed as ($\theta$zo+$\theta_I$+$\theta_J$, $\theta$yo) and ($\theta$zo+$\theta_I$+$\theta_J$, $\theta$yo+$\theta_G$); and six-fold data can thereby be obtained as compared with the ordinary sampling points P1, P7 . . . Because the number of slices is reduced to one-third of the number employed in the prior art, the time necessary for forming an image based on the tridimensional Fourier transformation is given by:

$$T_R \times (l/2) \times (n/3) = T_R ln/6$$

In other words, the time needed is reduced to one-sixth of the time taken in the prior art.

The invention has been described in detail with particular reference to certain preferred embodiments thereof, but it will be understood that variations and modifications can be effected within the spirit and scope of the invention.

What is claimed is:

1. In a magnetic resonance imaging method of obtaining images of slices of a body, comprising the steps of:
   in the first section, exposing the body placed in a static magnetic field to a first gradient magnetic field and applying high frequency magnetic field pulses having a decline angle smaller than 90° to excite nuclear spin within said slice having a predetermined thickness;
   in the second section, impressing a polarity-inverted first gradient magnetic field and second and third gradient magnetic fields perpendicular to the first gradient magnetic field and the gradient directions of the magnetic field thereof being perpendicular;
   in the third section, acquiring an NMR signal obtained from the slice at a predetermined sampling frequency; and
   repeating a sequence of the first, second and third sections while varying a value of gradient of the second gradient magnetic field, a plurality of the NMR signals obtained being subjected to Fourier transformation;
   said method being characterized by the steps of:
   impressing an additional second gradient magnetic field periodically varying at a frequency equal to or higher than the sampling frequency when acquiring the NMR signals; and
   effecting at least one additional sampling process after starting each sampling and before completing the sampling.

2. A magnetic resonance imaging method as set forth in claim 1, wherein the decline angle of the spin caused by the high frequency magnetic field pulses is 30°.

3. A magnetic resonance imaging method as set forth in claim 1 or 2, wherein an integrated value for one period of the additional second gradient magnetic field is zero.

4. In a magnetic resonance imaging apparatus having a magnet for producing and impressing a continuous static magnetic field on a body;

first, second and third gradient magnetic field coils for respectively generating a first, a second and a third orthogonal gradient magnetic fields;

a high-frequency coil for generating a high-frequency magnetic field pulse and for receiving an NMR signal transmitted from said body;

a control circuit for controlling said first, second and third orthogonal gradient magnetic field coils and said high-frequency coil (a) to cause, in a first section, said first gradient magnetic field coil and said high-frequency coil to generate said first orthogonal gradient magnetic field and the high-frequency magnetic field pulse, respectively, (b) to cause, in a second section, subsequent to said first section, said first, second and third gradient magnetic field coils to generate the first, second and third orthogonal gradient magnetic fields, respectively, and (c) to cause, in a third section, said third gradient magnetic field coil to generate said third gradient magnetic field and said high-frequency coil to receive the NMR signal from said body;

first sampling means for periodically sampling the NMR signal at a predetermined sampling frequency and storing sampled signal values; and a computer means for obtaining an image on the basis of the stored signal values:

the improvement characterized in that said control means comprises means operative in said third section to cause said second gradient magnetic field coil to generate a fourth gradient magnetic field periodically varying at a frequency equal to or higher than said predetermined sampling frequency, and second sampling means for sampling the NMR signal at least once between samples taken by said first sampling means.

5. In a magnetic resonance imaging method of obtaining images of slices of a body, comprising the steps of:

in the first section, exposing the body placed in a static magnetic field to a first gradient magnetic field and impressing approximately 90° pulses to the body to excite nuclear spin within the slice having a predetermined thickness;

in the second section, a polarity-inverted first gradient magnetic field and second and third gradient magnetic fields perpendicular to the first gradient magnetic field and the gradient directions of the magnetic field thereof being perpendicular to each other;

in the third section, impressing an approximately 180° pulse to the body;

in the fourth section, acquiring an NMR signal from the slice at a predetermined sampling frequency while impressing the third gradient magnetic field; and repeating a sequence of the first, second, third and fourth sections while varying a value of gradient of the second gradient magnetic field to obtain the images of the slices by Fourier transforming a plurality of the NMR signals, said method being characterized by the steps of:

impressing an additional first gradient magnetic field periodically varying at a frequency equal to the sampling frequency and an additional second gradient magnetic field periodically varying at a frequency which is at least double the sampling frequency when obtaining said NMR signals; and performing at least three additional sampling processes after starting each sampling and before completing the sampling.

6. A magnetic resonance imaging method as set forth in claim 5, wherein an integrated value for one period of each of the additional first and second gradient magnetic fields is zero.

7. In a magnetic resonance imaging apparatus comprising: a magnet for impressing a continuous static magnetic field on a body; first, second and third gradient magnetic field coils for generating three orthogonal gradient magnetic fields; a high frequency coil for generating an approximately 90° pulse and an approximately 180° pulse and for receiving an NMR signal from the body; a control circuit for controlling said gradient magnetic field coils and said high frequency coil, said control circuit including sampling means for acquiring the NMR signal at a predetermined sampling frequency; and computer means including image reforming means for obtaining an image on the basis of the NMR signal, the improvement being characterized in that said control circuit further includes means for generating an additional first gradient magnetic field periodically varying at a frequency equal to the sampling frequency and an additional second gradient magnetic field periodically varying at a frequency which is at least double the sampling frequency, and means for performing at least three sampling processes during each sampling.

8. A nuclear magnetic resonance imaging apparatus for forming an internal image of a body comprising:

means for generating a plurality of static and varying magnetic fields in a predetermined sequence and for impressing said fields on said body so that an NMR signal is generated within said body;

means for receiving said NMR signal;

first sampling means for periodically sampling values of said received NMR signal at a predetermined sampling frequency and for storing a first plurality of sampled signal values;

means for generating a periodic gradient magnetic field in addition to said plurality of static and varying magnetic fields, said additional magnetic field having a frequency equal to or higher than said predetermined sampling frequency;

second sampling means for sampling values of said NMR signal at least once between samples taken by said first sampling means and for storing a second plurality of signal values sampled by said second sampling means; and means for generating an image from said first plurality of stored signal values and from said second plurality of stored signal values.

9. A nuclear magnetic resonance imaging apparatus according to claim 8 wherein said means for generating a plurality of magnetic fields comprises a magnet for impressing a continuous static magnetic field on a body, means for impressing a plurality of orthogonal gradient magnetic fields on said body in a predetermined sequence and means for impressing a high-frequency magnetic field pulse on said body.

* * * * *